(12) United States Patent
Fischer et al.

(10) Patent No.: US 10,248,024 B2
(45) Date of Patent: Apr. 2, 2019

(54) METHOD FOR MAKING A MICRO- OR NANO-SCALE PATTERNED LAYER OF MATERIAL BY PHOTOLITHOGRAPHY

(71) Applicants: UNIV PARIS XIII PARIS-NORD VILLETANEUSE, Villetaneuse (FR); CENTRE NATIONAL DE LA RECHERCHE SCIENTIFIQUE (CNRS), Paris (FR)

(72) Inventors: Alexis Fischer, Bessancourt (FR); Getachew Ayenew, Saint Denis (ET); Azzedine Boudrioua, Soisy Sous-Montmorency (FR); Jeanne Solard, Deuil la Barre (FR)

(73) Assignees: UNIV PARIS XIII PARIS-NORD VILLETANEUSE, Villetaneuse (FR); CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 170 days.

(21) Appl. No.: 14/878,915

(22) Filed: Oct. 8, 2015

(65) Prior Publication Data
US 2017/0102617 A1    Apr. 13, 2017

(51) Int. Cl.
*G03F 1/50* (2012.01)
*G03F 7/20* (2006.01)
*G03F 1/00* (2012.01)

(52) U.S. Cl.
CPC .............. *G03F 7/2047* (2013.01); *G03F 1/00* (2013.01)

(58) Field of Classification Search
CPC ...... G03F 9/7023; G03F 9/7038; G03F 9/703; G03F 1/50; G03F 1/52; G03F 1/54
(Continued)

(56) References Cited

U.S. PATENT DOCUMENTS

| 6,084,938 A * | 7/2000 | Hara | G03F 7/70708 269/8 |
| 2010/0080954 A1* | 4/2010 | Mohseni | G03F 7/20 428/131 |

OTHER PUBLICATIONS

Ayenew, Getachew T. et al., "Self-Organized Nanoparticle Photolithography for Two-dimensional Patterning of Organic Light Emitting Diodes", Optical Society of America, Oct. 10, 2014, Ocis Codes: (220.4241) Nanostructure Fabrication; (160.4890) Organic Materials, 15 Pages.

(Continued)

*Primary Examiner* — Daborah Chacko-Davis
(74) *Attorney, Agent, or Firm* — Womble Bond Dickinson (US) LLP (57) ABSTRACT

The invention relates to a method for making a micro- or nano-scale patterned layer of material by photolitography, comprising steps of:
  positioning a photomask between a light source and a layer of light sensitive material, said mask comprising a support and a layer of micro- or nano-light focusing elements fixed to the support,
  activating the light source so that the light source emits light radiations through the mask towards a surface of the layer of light sensitive material,
  developing the layer of light sensitive material so as to obtain the micro- or nano-scale patterned layer of material,
  wherein, during exposure of the layer of light sensitive material to light radiations, the photomask is positioned relative to the light sensitive layer so that the distance between the surface of the light sensitive layer and the layer of micro- or nano-light focusing elements is greater than a back focal length of the micro- or nano-light focusing elements.

12 Claims, 9 Drawing Sheets

(58) Field of Classification Search
USPC .................................................. 430/397, 396
See application file for complete search history.

(56) References Cited

OTHER PUBLICATIONS

Chan, Chia-Hua, et al., "Patterning Periodical Motif on Substrates Using Monolayer of Microspheres: Application in Gan Light-emitting Diodes", The Japan Society of Applied Physics, Feb. 5, 2009, 3 Pages.

Hou, Chia-Hung, et al., "Output Power Enhancement of Light-Emitting Diodes Via Two-Dimensional Hole Arrays Generated by a Monolayer of Microspheres", American Institute of Physics, Appl. Phys. Lett. 95, 133105, Sep. 28, 2009, 3 Pages.

Wu, Wei, et al.,"Fabrication of Large Area Periodic Nanostructures Using Nanosphere Photolithography", Nano Express, Nanoscale Res Lett (2008) 3:351-354, Sep. 9, 2008, 4 Pages.

Wu, Ming-Hsien, et al., "Fabrication of Arrays of Two-Dimensional Micropatterns Using Microspheres as Lenses for Projection Photolithography", Applied Physics Letters vol. 78, No. 16, Apr. 16, 2001, 3 Pages.

\* cited by examiner

METHOD FOR MAKING A MICRO- OR NANO-SCALE PATTERNED LAYER OF MATERIAL BY PHOTOLITHOGRAPHY

FIELD OF THE INVENTION

The invention relates to a method for making a micro- or nanoscale patterned layer of material by photolithography.

TECHNICAL BACKGROUND

With the great advance of nanotechnology, there is an increasing demand for rapid parallel manufacturing strategies for nanostructures like nano-holes and nano-pillars. Some applications that require repetitive (periodic) uniform nano-holes and nano-pillars over large areas are photonic crystals, memory devices, OLED nano-filtration, solar cells, artificial kidney, etc.

Conventional photolithography techniques cannot satisfy the requirements of the nano-patterns, due to the wavelength limit of the light source used. Novel techniques like X-ray, electron beam, and focused ion beam techniques are either slow or expensive for manufacturing such repetitive (periodic) patterns over large areas. Highly monodisperse micro- and nano-spheres can self-organize to form a hexagonally close packed (HCP) self-assembled monolayer and have attracted widespread attention for making large area periodic nanostructures. One important example is the Nanosphere Lithography (NSL) technique, which uses planar ordered arrays of micro/nanospheres as a lithography mask to generate ordered nanoscale arrays on a substrate.

Document "Fabrication of Large Area Periodic Nanostructures Using Nanosphere photolithography", Wei Wu et al, Nanosclae Res. Lett. (2008) 3, pp. 351-354 disclosesfor instance a method that uses a photoresist layer covered with a self-assembled ordered monolayer of hexagonally close packed silica micro-spheres (each micro-sphere having a diameter of 1 micrometer). The photoresist layer is exposed UV radiations (centered at a wavelength of about 400 nanometers) through the monolayer of micro-spheres. During exposure, each micro-sphere acts as a micro-lens, focusing the light radiations on the photoresist layer so as to generate patterns of nano-holes having a diameter of about 180 nanometers and a periodicity of 1 micrometer in the phororesist layer. Gold and aluminum films having nano-holes are formed by lift-off on the photoresist nanopillars.

However, in such a mask-less method, the micro-spheres must be deposited on the photoresist layer before exposure to UV radiations, and then removed afterward, in a wet process. Therefore, the micro-spheres cannot be reused and deposition of the self-organized microspheres must be repeated for each sample preparation.

Document "Fabrication of arrays of two-dimensional micropatterns using microspheres as lenses for projection photolithography", Ming-Hsien Wu et al, Applied Phys Letters, vol. 78, no. 16, pp. 2273-2275, discloses a method for forming a repetitive, micrometer-scale pattern in a photoresist layer using an array of polystyrene microspheres (having a diameter of 1.5 micrometers) embedded in a poly(dimethylsiloxane) membrane. The transparent microspheres act as lenses which project the image of an illuminated mask on the photoresist layer. The thickness of the membrane is chosen so that, when the membrane is held in conformal contact with the photoresist layer, the microspheres are held at an appropriate distance from the photoresist, corresponding to the focal length of a microsphere. After exposure to light radiations, the membrane is peeled from the photoresist layer and the photoresist layer is developed in a solution of sodium hydroxide.

Such a method allows generating a repetitive, micrometer-scale pattern in the photoresist, the pattern having a spatial period which is equal to the diameter of the microspheres, i.e. about 1 or 1.5 micrometers. As the spatial period of the resulting pattern is equal to the diameter of the microspheres, adjustment of the spatial period may only be obtained by using micro-spheres of different sizes.

SUMMARY OF THE INVENTION

One aim of the invention is to provide a technique which would allow to produce, by photolithography using a reusable mask made of self-organized particles, a micro- or nano-scale patterned layer of material, wherein the pattern may have a spatial period which is less than the micro- or nano-particles size.

Another aim of the invention is to produce, by photolithography, a micro- or nano-scale patterned layer of material, wherein the pattern may have a spatial period which is less than 1 micrometer, preferably less than 800 nanometers, and which may be of the order of the wavelength of the light radiations used to illuminate the layer of material (for instance, a pattern having a spatial period of 450 nanometers for a wavelength of 405 nanometers, or a pattern having a spatial period of 250 nanometers for a wavelength of 220 nanometers).

According to a first aspect, the invention provides a method for making a micro- or nano-scale patterned layer of material by photolithography, comprising steps of:

positioning a photomask between a light source and a layer of light sensitive material, said photomask comprising a support and a layer of micro- or nano-light focusing elements fixed to the support, activating the light source so that the light source emits light radiations through the photomask towards the layer of light sensitive material, developing the layer of light sensitive material so as to obtain the micro- or nano-scale patterned layer of material, wherein, during exposure of the layer of light sensitive material to light radiations, the photomask is held at a distance relative to the light sensitive layer such that the layer of light sensitive material is exposed to:

light radiations collected by each micro- or nano-light focusing element and which are focused on the light sensitive layer, and light radiations passing through at least two adjacent micro- or nano-light focusing elements and which interfere constructively with each other, so as to generate, in the layer of light sensitive material, a micro- or nano-scale pattern having a spatial period which is smaller than the spatial period of the layer of micro- or nano-light focusing elements.

During exposure to light radiations, the light sensitive layer is subjected to a light intensity distribution resulting from two phenomena. First, light radiations collected by each micro- or nano-light focusing element are focused on the light sensitive layer, thus creating within the light sensitive layer, primary peaks of electric field intensity located in line with the micro- or nano-light focusing elements. Second, light radiations passing through two adjacent micro- or nano-light focusing elements interfere constructively with each other, thus creating within the layer of light sensitive material, secondary peaks of electric field intensity located between primary peaks.

In other words, the light intensity distribution within the light sensitive layer is generated not only by focusing light radiations on this layer but also by creating light interferences within the layer.

As a result, the electric field created in the layer of light sensitive material has a spatial quasi-period which is less than the spatial period of the array formed by the micro- or nano-light focusing element.

In order to achieve this result, the distance between the middle plane of light sensitive layer and the layer of micro- or nano-light focusing elements must be greater than the back focal length of the micro- or nano-light focusing elements.

In particular, the middle plane of the light sensitive layer may be held in a plane of interference where light radiations passing through one micro- or nano-light focusing element interferes constructively with light radiations passing through at least one adjacent micro- or nano-light focusing element so as to create a light intensity distribution having a spatial quasi-period which is half the spatial period of the layer of micro- or nano-light focusing elements.

More precisely, the distance between the middle of the light sensitive layer and the layer of micro- or nano-light focusing elements may be greater than or equal to:

$$S = d\left(\frac{n_{bl}}{4(n_{bl}-1)} - \frac{1}{2} + \sqrt{\left(\frac{n_m n_{bl}}{2(n_{bl}-1)}\right)^2 - 1}\right)$$

where d is a spatial period of the layer of micro- or nano-light focusing elements, $n_{bl}$ is a refractive index of the micro- or nano-light focusing elements and $n_m$ is a refractive index of a medium extending between the layer of micro- or nano-light focusing elements and the layer of light sensitive material.

According to an embodiment of the invention, the photomask and the layer of light sensitive material may be separated from each other by a gap, the gap being filled with air.

The gap may have a thickness less than 20 micrometers.

The light source may emit light radiations at a wavelength comprised between 125 and 405 nanometers.

The micro- or nano-light focusing elements may be spherical micro- or nano-particles.

The photomask may comprise one or more superposed layers of monodispersed micro- or nano-light focusing elements.

The monodispersed micro- or nano-light focusing elements may be hexagonally close packed. In such a case, each micro- or nano-light focusing element has six adjacent micro- or nano-light focusing elements within the same layer.

Adjacent micro- or nano-light focusing elements may be in contact with each other or spaced from each other in the layer.

The support may be made of a material which is transparent at a wavelength of the radiations emitted by the light source and may comprises a planar surface on which the micro- or nano-light focusing elements are attached.

The light sensitive material may be a positive resist, so that the micro- or nano-scale patterned layer of material is patterned with micro- or nano-holes.

Alternately, the light sensitive material may be a negative resist, so that the so that the micro- or nano-scale patterned layer of material is patterned with micro- or nano-pillars.

According to a second aspect, the invention relates to a micro- or nano-scale patterned layer of material obtained by a method as defined previously.

Such a micro- or nano-scale patterned layer of material may have a spatial period which may be less than 1 micrometer, preferably less than 800 nanometers.

According to a third aspect, the invention relates to a method for manufacturing a film having periodic micro- or nano-pillars, comprising steps of:

depositing a film of material on the micro- or nano-scale patterned layer as defined previously, said micro- or nano-scale patterned layer being patterned with micro- or nano-holes, so that the material of the film fills the micro- or nano-holes, and removing the micro- or nano-scale patterned layer so as to recover the film having periodic micro- or nano-pillars.

The invention also relates to a method for manufacturing a metallic film having periodic micro- or nano-holes, comprising steps of:

depositing a film of material on the micro- or nano-scale patterned layer as defined previously, said micro- or nano-scale patterned layer being patterned with micro- or nano-pillars, so that the material of the film fills the spaces between the micro- or nano-pillars, and removing the micro- or nano-scale patterned layer so as to recover the film having periodic micro- or nano-holes.

The material of the film may be an electrically conductive material, such as metal (for instance gold or aluminum) or graphene, a dielectric material or an electrical insulator.

In case the material of the film is a metal, the film may be deposited on the micro- or nano-scale patterned layer by electron-beam evaporation.

According to a fourth aspect, the invention relates to the use of a method as defined previously for manufacturing an insulating film deposited in contact with an electrode in an organic light-emitting diode (OLED).

According to a fifth aspect, the invention relates to a method for making a micro- or nano-scale patterned layer of material by photolithography, comprising:

in a first step, positioning a photomask between a light source and a photoresist layer, said photomask comprising a support and a layer of adjacent spherical micro- or nano-particles arranged on the support, each particle having a diameter D, in a second step, activating the light source, so that the light source emits light radiations through the support and the adjacent spherical micro- or nano-particles of the photomask, towards the photoresist layer, in a third step, developing the photoresist layer so as to obtain the micro- or nano-scale patterned layer of material, wherein, during the first step, the photomask is displaced relative to the photoresist layer:

from a first position wherein the photomask is in contact with the photoresist layer under vacuum or under mechanical pressure, to a second position, different from the first position, by introducing a gap of air between the photoresist layer and the layer of adjacent spherical micro- or nano-particles, so that during the second step, light radiations stemming from focusing of each spherical micro- or nano-particles and light radiations stemming from constructive interferences between adjacent spherical micro- or nano-particles allow to generate, in the photoresist layer, a micro- or nano-scale pattern with a period p smaller than the diameter D of the spherical micro- or nano-particles.

According to an embodiment of the invention, the gap of air is adjusted so that a period p of the micro- or nano-scale pattern is equal to half the diameter D of the micro- or nano-spherical spheres, each pattern having a same diameter f less than the diameter D.

According to an embodiment of the invention, the spherical micro- or nano-particles are self-organized and are disposed in an array, or in particular arrangement, such as a squared lattice arrangement, or an hexagonally close packed arrangement where some spherical micro- or nano-particles have been removed.

The support may comprise several superposed layers of micro- or nano-spherical particles.

The diameter of the micro- or nano-spherical particles may be less than 2 micrometers for obtaining a spatial period of the pattern less than 420 nanometers.

The support may be made of a quartz substrate which is transparent at wavelength of the light radiations emitted by the source, and the adjacent spherical micro- or nano-particles may be monodispersed silicon dioxide or polystyrene spherical particles.

The photomask may be displaced in translation relative to the photoresist layer by piezoelectric shims.

According to a sixth aspect, the invention relates to a reusable photomask intended to be used in photolithography, the photomask comprising a self-organized monolayer of micro- or nano-particles. This reusable photomask comprises at least a planar support and at least one layer of spherical micro- or nano-particles disposed on and attached to this planar support for making, by photolithography, a micro or nano-scale patterned layer of material having a given spatial period.

This photomask can have two or more planar supports, intended for being positioned at different distances from the layer of light sensitive material, each planar support having one layer of spherical micro- or nano-spherical particles, which allows to create a pattern in the layer of light sensitive material, the pattern having different areas with different spatial periods, each period corresponding to one associated planar support, without displacing the photomask relative to the photoresist layer.

With one same reusable mask, it is thus possible to have different diameters of the micro- or nano-holes or pillars forming the pattern in the layer of sensitive material by tuning the wavelength of the light source, while keeping a spatial period of the pattern equal to half the period of the layer of spherical micro- or nano-spherical particles (d/2).

The proposed method finds application in different technologies, such as OLED, filtration, making metal nanostructures (plasmonic applications), making nanostructures for devices like photovoltaic cells (efficiency enhancement).

BRIEF DESCRIPTION OF THE DRAWINGS

The invention will be described in more details with reference to the following drawings, in which.

DETAILED DESCRIPTION OF ONE EMBODIMENT

Figure 1:
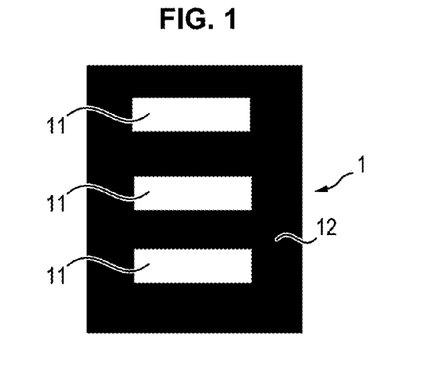
FIG. 1 schematically shows a contour mask which may be used in a method for making a micro- or nano-scale patterned layer of material according to an embodiment of the invention, FIG. 2 schematically shows a photomask which may be used in the method for making a micro- or nano-scale patterned layer of material according to an embodiment of the invention, FIG. 3 schematically shows different steps of the method for making a micro- or nano-scale patterned layer of material according to an embodiment of the invention.
Figure 2:
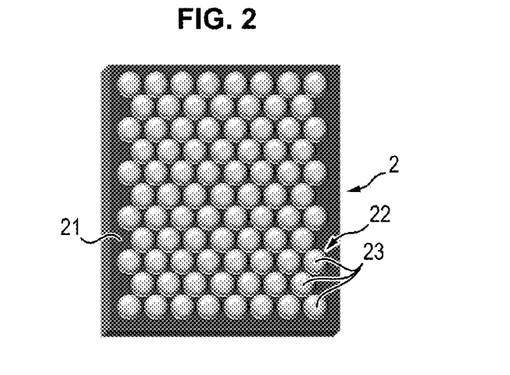
Figure 3:
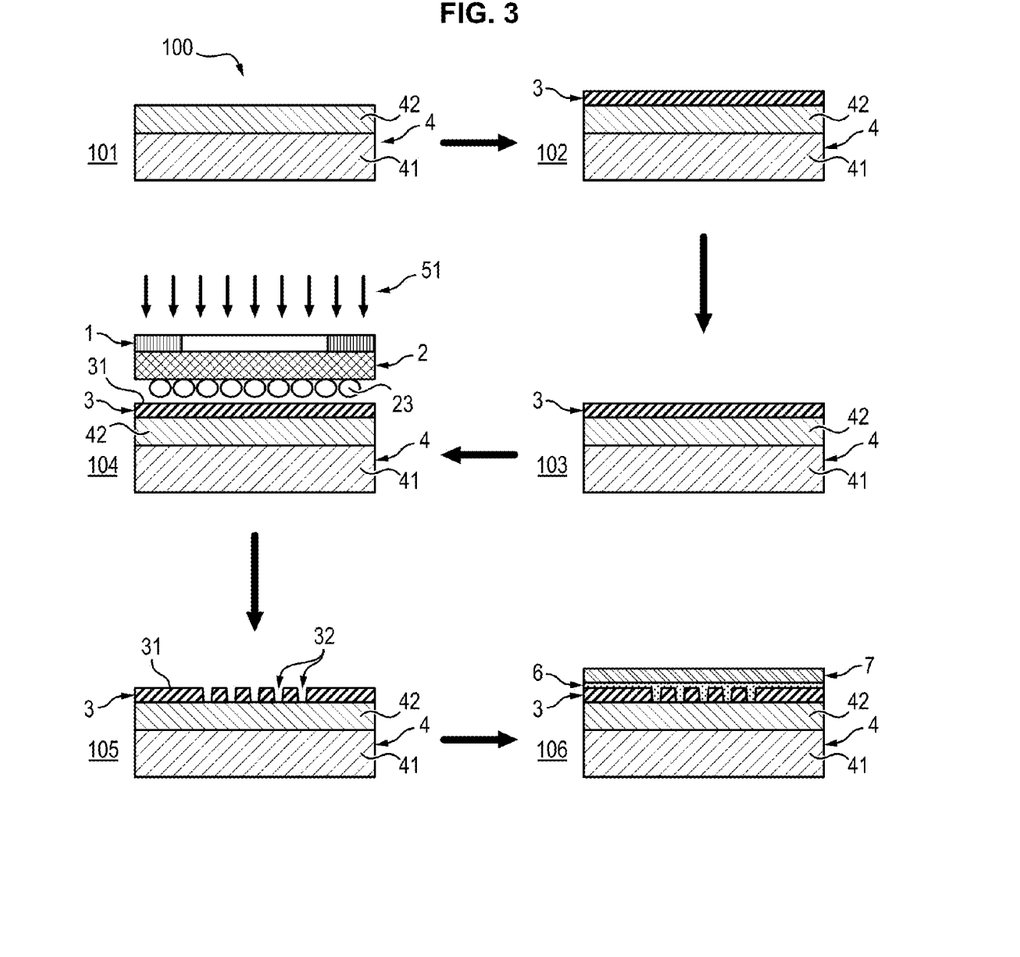

FIGS. 1 to 3 illustrate a method for making a micro- or nano-scale patterned layer of material which may be used for instance as an insulating film deposited in contact with an electrode in an organic light-emitting diode (OLED).

FIG. 1 shows a contour mask 1 which may be used for selecting regions of the layer of light sensitive material where a pattern is to be transferred.

Such a contour mask 1 may be made of a printed plastic layer having several rectangular regions 11 which are transparent to light radiations (in the present case UV radiations) and a light blocking region 12 surrounding the transparent regions 11, the light blocking region 12 being opaque to light radiations.

FIG. 2 shows a photomask 2 comprising a support 21 and one or more layer(s) 22 of micro- or nano-light focusing elements 23 fixed to the support with a spatial period d.

The support 21 may comprise a quartz plate.

The micro- or nano-light focusing elements 23 may be spherical nano-particles of silicon dioxide ($SiO_2$) or polystyrene or other oxide materials (for example ZnO, $TiO_2$), with a diameter D. The nano-particles 23 are identical. They have been deposited in a self-organized manner on the quartz plate. More precisely, the micro- or nano-particles 23 are hexagonally close packed. The micro- or nano-particles 23 have a diameter comprised between 700 nanometers and 2.34 micrometers, depending on the desired spatial period of the pattern to be achieved.

Alternatively, the micro- or nano-light focusing elements 23 may have the shape of a right circular cylinder or have an oval shape.

Moreover, the layer 22 of micro- or nano-light focusing elements 23 could comprise first particles having a first size and second particles having a second size, arranged side by side, alternately.

FIG. 3 schematically shows different steps of the method 100 for making a micro- or nano-scale patterned layer of material according to an embodiment of the invention.

As illustrated on FIG. 3, the method 100 comprises the following steps:

According to a first step 101, a substrate 4 is provided. In the example illustrated on FIG. 3, the substrate 4 is a glass plate 41 coated with a conductive indium tin oxide (ITO) 42.

According to a second step 102, a layer of photoresist 3 is deposited on a substrate 4. The layer of photoresist 3 is deposited by spin coating. The thickness of the layer of photoresist 3 may be comprised between 50 nanometers and 1 micrometers, preferably between 200 nanometers and 500 nanometers.

According to a third step 103, the layer of photoresist 3 is soft-baked in order to reduce the remaining solvent concentration in the photoresist.

According to a fourth step 104, the contour mask 1 and the photomask 2 are positioned between a light source and the layer of photoresist 3.

During this step, the photomask can be shifted relative to the photoresist layer from a first position wherein the photomask is in contact with the photoresist layer under vacuum or under mechanical pressure, to a second position, different from the first position, by introducing a gap of air (or of other material) between the photoresist layer and the layer of adjacent spherical micro- or nano-particles.

The introduction of the gap of air can be achieved by suppressing or modifying the vacuum created for holding the photomask in the first position.

The second position is adjusted so that the distance between the middle plane of the layer of photoresist 3 and the layer 22 of micro- or nano-light focusing elements 23 is greater than the back focal length of the micro- or nano-light focusing elements.

In order to finely adjust the position of the photomask, the photomask may be displaced in translation relative to the layer of light sensitive material by piezoelectric shims.

The light source is then activated, while the photomask 4 is held in the second position, so that the light source emits light radiations 51 through the contour mask 1 and the photomask 2 towards the free surface 31 of the layer of photoresist 3.

The light source may emit light radiations 51 at wavelengths in the ultraviolet or deep ultraviolet spectrum (less than 405 nanometers). Typically, the light source can be chosen so as to emit light radiations 51 at a wavelength comprised between 125 and 405 nanometers, depending on the chemical composition and thickness of the layer 3 of photoresist.

During this step, the micro- or nano-particles 23 deviate the light radiations 51 emitted by the light source so as to modulate the distribution of the electric field generated by the light radiations in the photoresist layer 4. The electric field generated in the photoresist layer 3 has the effect of modifying the solubility of the photoresist.

The second position of the photomask 2 has been previously adjusted (or tuned) so that the distance between the free surface 31 of the layer of photoresist 3 and the micro- or nano-particles 23 allows the layer of light sensitive material to be exposed to two types of light radiations:
  light radiations collected and focused on the light sensitive layer by each individual micro- or nano-light focusing element, and
  light radiations passing through two adjacent micro- or nano-light focusing elements and which interfere constructively with each other.

The term "adjacent" refers to a micro- or nano-light focusing element which is an immediate neighbor for another micro- or nano-light focusing element in the layer of micro- or nano-light focusing elements. Two adjacent micro- or nano-light focusing elements are arranged side by side in the layer of micro- or nano-light focusing elements. They may be in contact with each other or not.

As a result, the light radiations deviated by the micro- or nano-light focusing elements generate, in the photoresist layer, a micro- or nano-scale pattern with a spatial quasi-period p which is smaller than the spatial period d of the micro- or nano-light focusing elements.

In case the photoresist is a positive type resist, portions of the photoresist layer 3 that are exposed to sufficient light radiations becomes soluble while portions of the photoresist layer 3 that are unexposed remain insoluble.

Conversely, in case the photoresist is a negative type resist, portions of the photoresist layer 3 that are exposed to sufficient light radiations becomes insoluble, while unexposed portions of the photoresist layer 3 remain soluble.

According to a fifth step 105, the photoresist layer 3 is developed. Development consists in applying an appropriate solvent (called "developer") on the photoresist layer 3 so as to eliminate the portions of the photoresist layer 3 which are soluble. This step leads to the formation of a micro- or nano-scale pattern 32 in the photoresist layer 3.

In case the photoresist if a positive type resist, the micro- or nanoscale pattern 32 is made of an array of micro- or nano-holes.

In case the photoresist is a negative type resist, the micro- or nanoscale pattern 32 is made of an array of micro- or nano-pillars.

Depending on the distance between the surface 31 of the photoresist layer 3 and the layer of micro- or nano-particles 23 during the fourth step 104, the spatial period of the created pattern 32 may be less than the spatial period d of the array formed by the micro- or nano-particles 23.

At the end of the fifth step 105, the photoresist layer 3 may be rinsed to remove the remaining developer, and dried.

According to a sixth step 106, a layer of organic semiconductor 6 and a metallic film 7 are deposited on the micro- or nano-scale patterned layer of photoresist 3. The micro- or nano-scale patterned layer of photoresist 3 is used as a mold for structuring the layer of organic semiconductor 7.

In case the photoresist is a positive type resist, the layer of organic semiconductor 6 is structured with a micro- or nano-scale pattern made of an array of micro- or nano-pillars.

Conversely, in case the photoresist is a negative type resist, the layer of organic semiconductor 6 is structured with a micro- or nano-scale pattern made of an array of micro- or nano-holes.

The same method may be used for manufacturing a metallic film having a micro- or nano-scale pattern.

In such as case, a metallic film is deposited directly on the micro- or nano-scale patterned layer of photoresist 3 for example by evaporation or by chemical vapor deposition (CVD). The micro- or nano-scale patterned layer 3 is then removed so as to recover a metallic film having a micro- or nano-scale pattern.

Figure 4A:
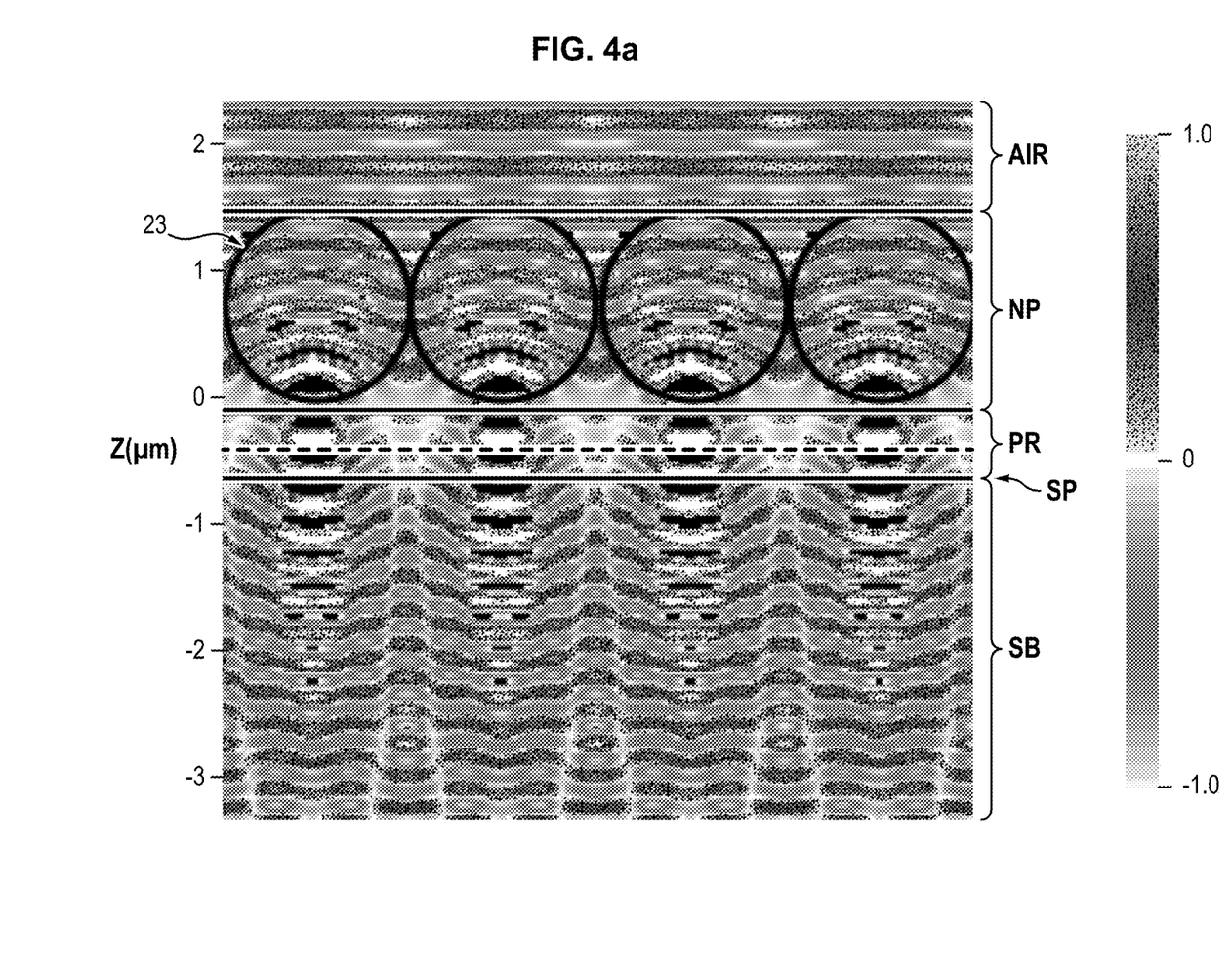
FIGS. 4(a), 4(b), 4(c) and 4(d) are diagrams showing a result of a numerical simulation of the distribution of the electric field generated in the layer of light sensitive material when the of micro- or nano-light focusing elements are positioned in contact with the surface of the layer of light sensitive material (FIGS. 4(a) and 4(b)), and when the of micro- or nano-light focusing elements are positioned at a distance from the surface of the layer of light sensitive material (FIGS. 4(c) and 4(d)), respectively.

FIG. 4(a) is a diagram showing a result of a numerical simulation of the distribution of the electric field intensity in a plane perpendicular to the photoresist layer 3 during the fourth step 105, in case the micro- or nano-light focusing elements 23 are positioned in close contact with the surface 31 of the layer of photoresist 3.

In this simulation, the incident light beam is emitted by a Hg light source of a mask aligner at wavelength $\lambda=405$ nanometers. The incident light beam is assumed to travel in a downward direction. It successively passes through the air, the micro- or nano-particles (NP) (with a diameter D=1.68 micrometers and refractive index $n_{bi}=1.47$), the photoresist (PR) (thickness e=200 nanometers with refractive index $n_{PR}$=1.69) and the glass substrate (SB) (with refractive index $n_{SB}$=1.5).

In order to improve the contact between the micro- or nano-particles and the photoresist layer, air between the photomask and the photoresist layer has been previously pumped, so that the micro- or nano-particles 23 are maintained in contact against the surface 31 of the photoresist layer 3 under vacuum.

Alternately, the photomask may be maintained in contact against the surface 31 of the photoresist layer 3 by exerting a mechanical pressure on the photomask 2.

Figure 4B:
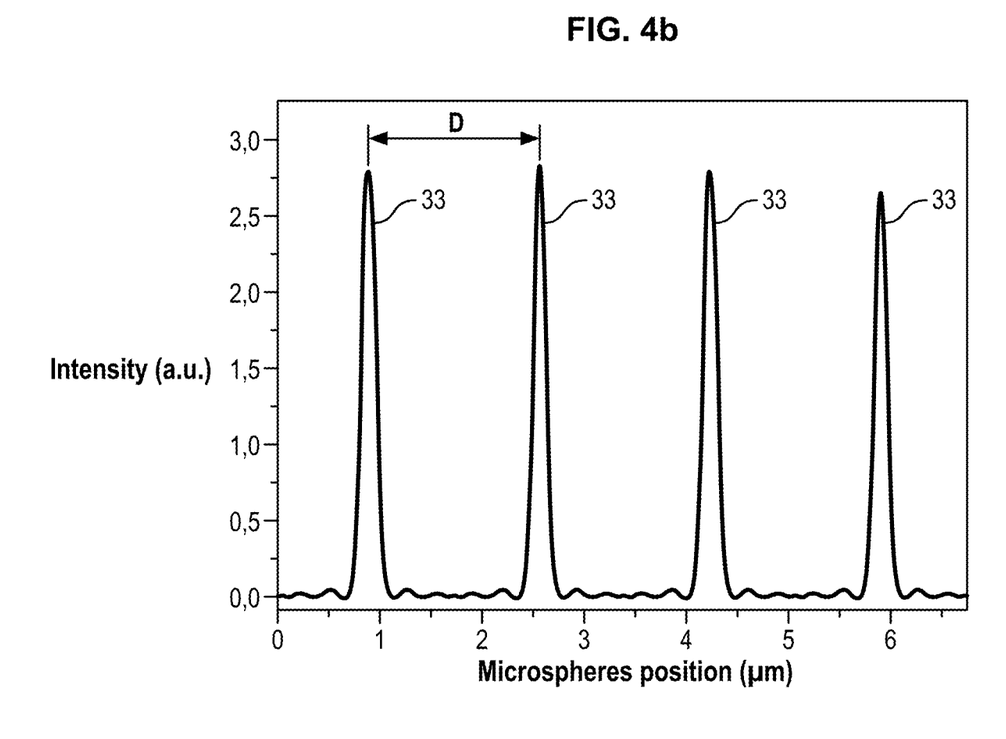

FIG. 4(b) diagrammatically shows a profile of the electric field intensity at the middle plane of the layer 3 of photoresist.

From FIG. 4(b), an optical focusing effect due the micro- or nano-particles can be observed as judged by the field intensity distribution with a period matching the spatial period d of the micro- or nano-particles array. With this regard, each micro- or nano-particle 23 can be modeled as a micro ball-lens focusing light.

It can also be observed on FIGS. 4(a) and 4(b) that the light radiations collected by each micro- or nano-light focusing element 23 are focused within the layer of photoresist 3, thus creating within the photoresist layer peaks 33 of electric field intensity, said peak being located in line with the micro- or nano-light focusing elements 23.

As a result, the spatial period of the electric field generated in the layer of photoresist 3 is equal to the spatial period d of the array of micro- or nano-light focusing elements 23.

Figure 4C:
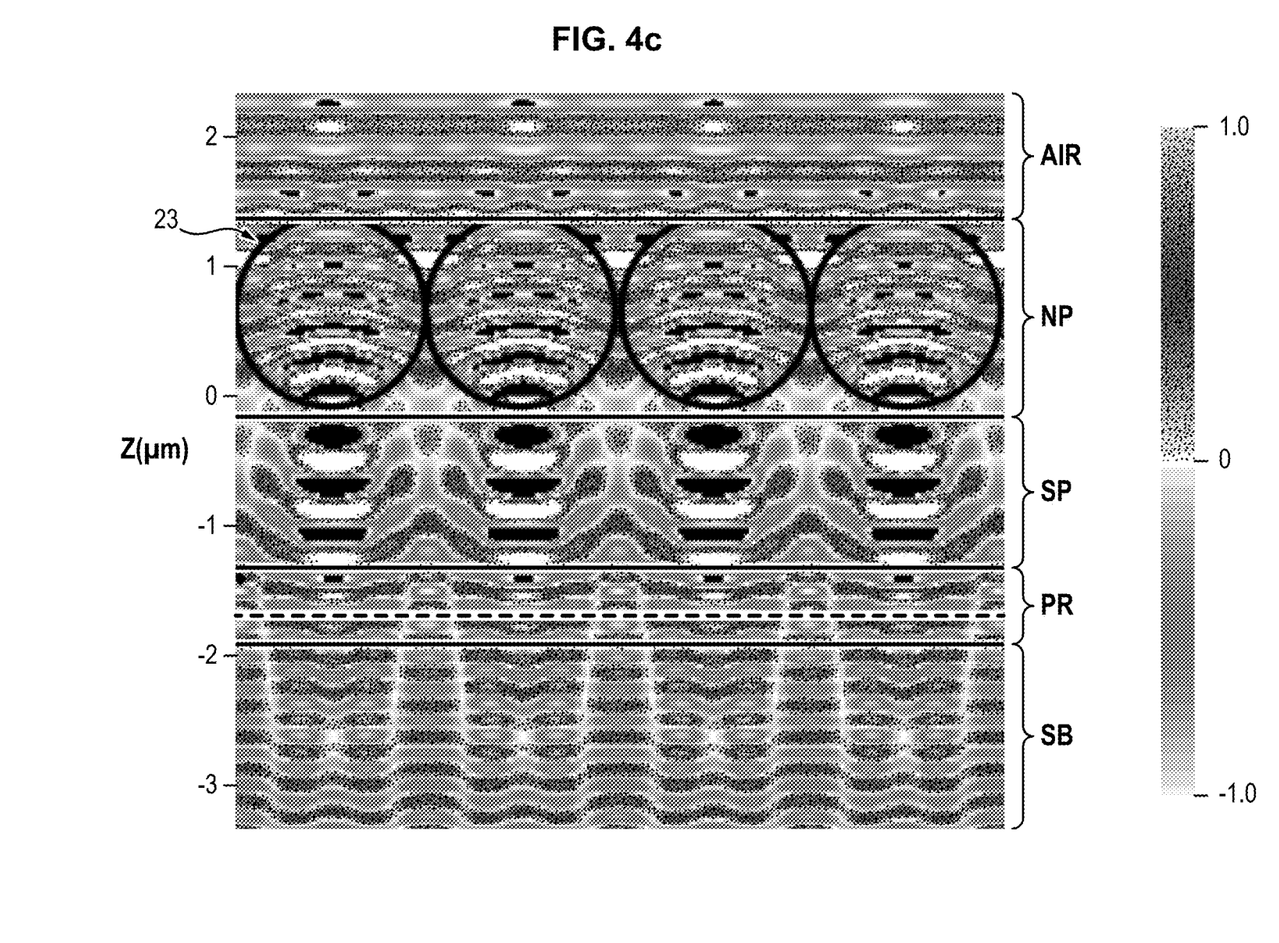

FIG. 4(c) is a diagram showing a result of a numerical simulation of the distribution of the electric field intensity in a plane perpendicular to the photoresist layer during the fourth step 104, in case the micro- or nano-light focusing elements 23 are positioned at a distance from the surface 31 of the layer of photoresist 3, said distance being greater than the back focal length of the micro- or nano-light focusing elements 23.

In the present case, an air gap (h=1.5 micrometers) (SP) has been introduced between the photomask 2 and the photoresist layer 3. The back focal length of the micro- or nano-light focusing elements 23 is equal to about 400 nanometers. The electric field arising from light passing through two adjacent micro- or nano-light focusing elements 23 interfere with each other within the photoresist layer 3. This leads to a phase-mask effect and introduce an electrical field intensity modulation at a spatial period d/2 which half the period d of the micro- or nano-light focusing element diameter.

Figure 4D:
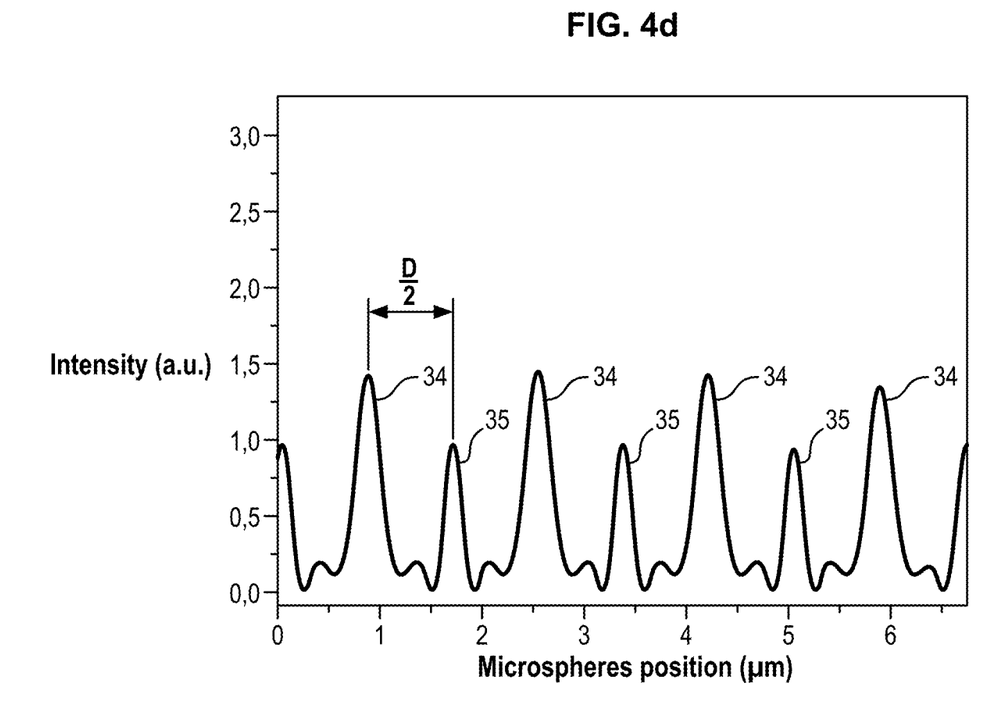

FIG. 4(d) diagrammatically shows a profile of the electric field intensity at the middle plane of the layer of photoresist 3.

It can be observed that the layer of photoresist 3 is subjected to a light intensity distribution resulting from two simultaneous phenomena.

First, the light radiations collected by each micro- or nano-light focusing element 23 are focused within the layer of photoresist 3, thus creating primary peaks 34 of maximum electric field intensity located in line with the micro- or nano-light focusing elements 23. These light radiations allow to generate, in the photoresist layer first micro- or nano-holes or pillars having a diameter f1 and a period equal to d.

Second, light radiations passing through two adjacent micro- or nano-light focusing elements 23 interfere with each other constructively within the layer 3 of phororesist, thus creating secondary peaks 435 of maximum electric field intensity located between primary peaks 34. These light radiations allow to generate, in the photoresist layer, second micro- or nano-holes or pillars having a diameter f2 and a period equal to d.

As a result, the electric field generated in the layer of photoresist 3 has a spatial quasi-period d/2 which is half the spatial period d of the array formed by the micro- or nano-light focusing elements 23.

The terms "spatial quasi-period" refer here to the distance between two successive peaks in the electric field intensity. The secondary peaks may have a maximum intensity which is less that the maximum intensity of the primary peaks, but which is sufficient to modify the chemical structure of the photoresist layer in order to form micro- or nano-holes or pillars. For instance, the secondary peaks may have a maximum intensity which is at least 50% of the maximum intensity of the primary peaks.

More precisely, in the example shown on FIG. 4(d), the intensity profile exhibits a quasi-period D/2 that corresponds to half the micro- or nano-particles diameter. The first micro- or nano-holes and the second micro- or nano-holes have similar diameter size.

However, depending on the distance between the layer of photoresist 3 and the layer 22 of the focusing elements, it would be possible to obtain first holes having a first diameter f1 which is different from the second diameter f2 of the second holes.

This can be explained by modeling the array of micro- or nano-particles as a grating with a pitch d. A phase-mask effect occurs as the optically transmitted beams from the grating order +1 and −1 interfere constructively.

This configuration allows obtaining a layer of photoresist 3 which is patterned with an array of micro- or nano-holes or micro- or nano-pillars having a spatial period which half the spatial period of the array of micro- or nano-light focusing elements 23.

Figure 5A:
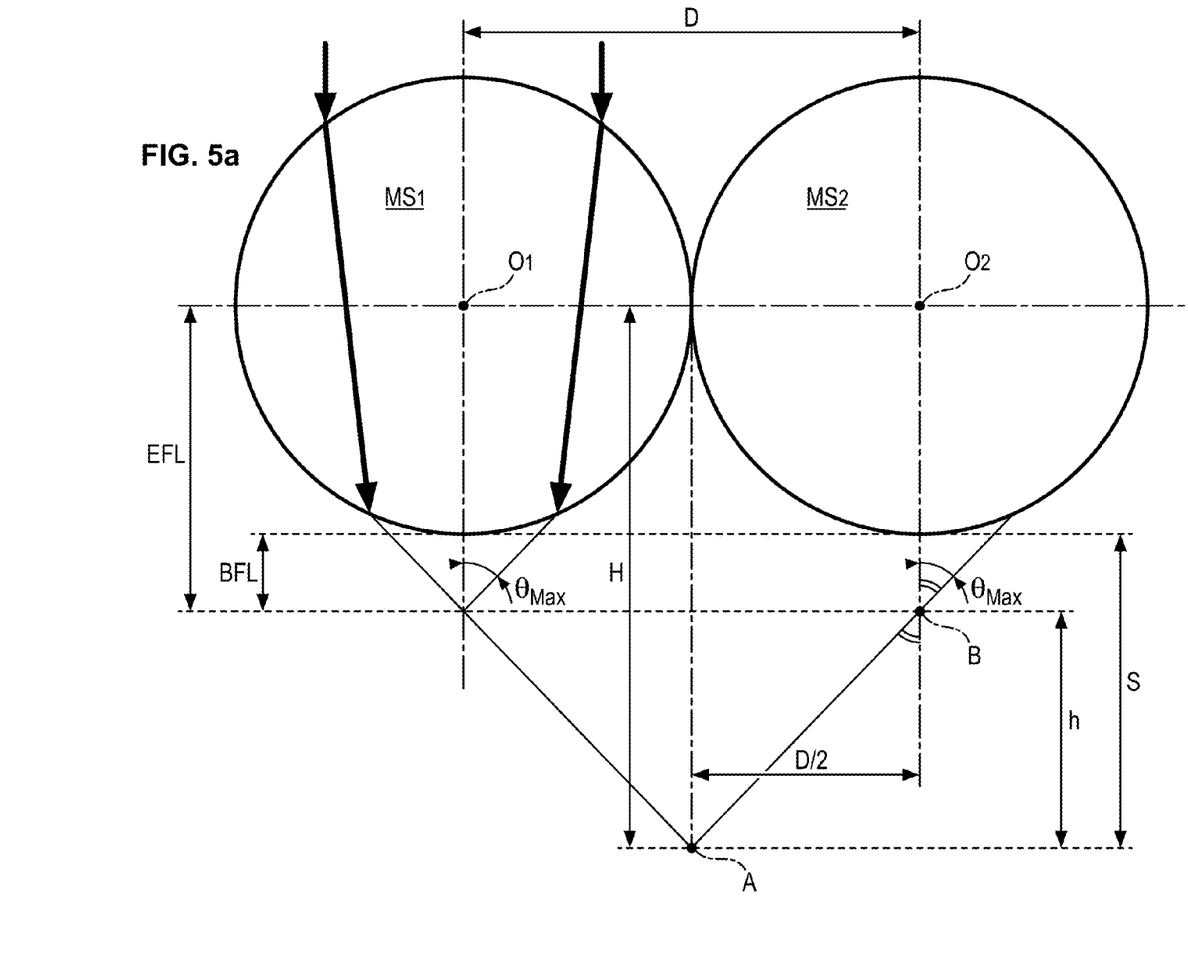
FIGS. 5(a)-5(c) show the optical path of the light radiations and the interferences conditions (FIG. 5(a)), the aperture angle and the photomask (or phase mask) angle as a function of the diameter of the micro- or nano-light focusing elements (FIG. 5(b)), and the distance between the surface of the light sensitive layer and the layer of micro- or nano-light focusing elements for the existence of an interference between orders +1 and −1 (FIG. 5(c))

FIG. 5(a) shows the optical path of the light radiations through two adjacent micro- or nano-focusing elements 23.

Figure 5B:
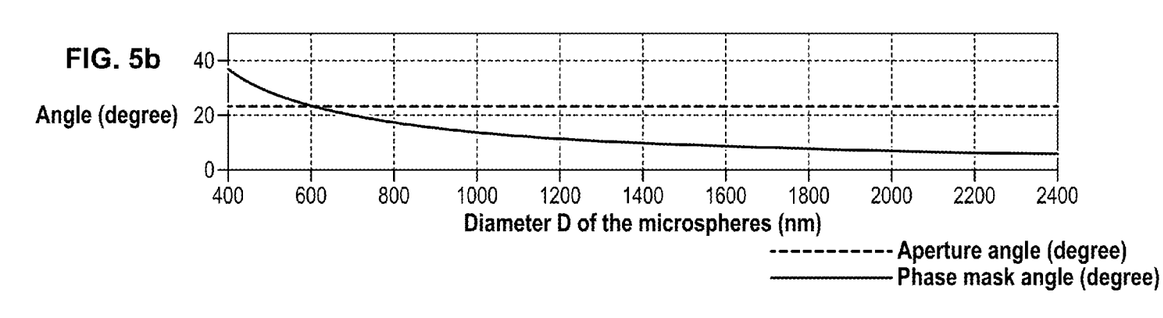
Figure 5C:
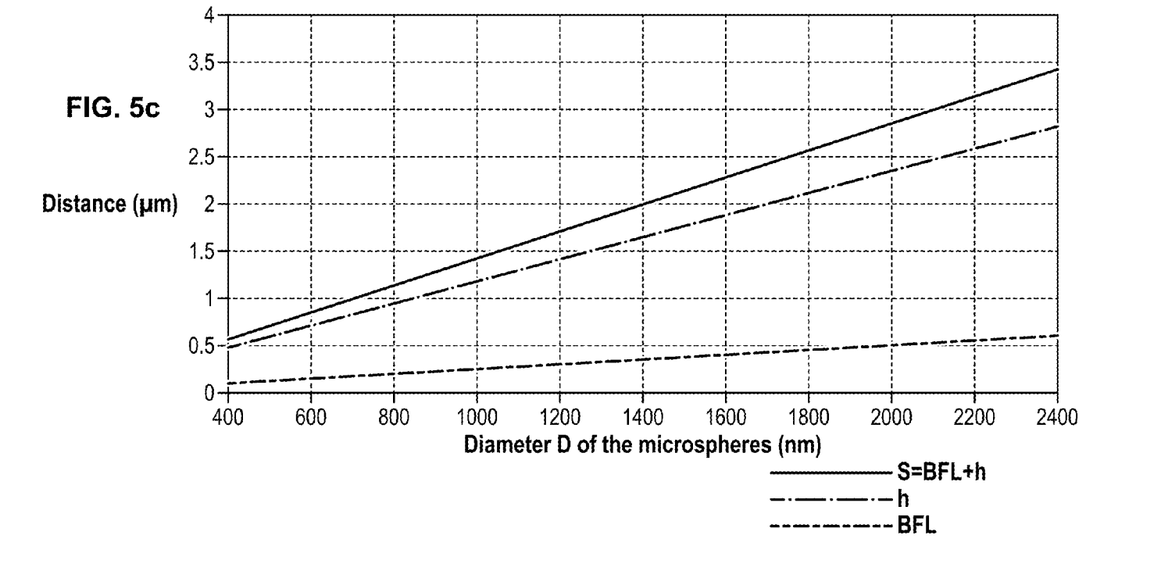

Unlike the case of blazed gratings, and because of the symmetry of the structure, both transmitted beams for grating order +1 and −1 can exist under the normal incidence condition if satisfying the condition shown in Equation (1). The angle of transmission θ of the order m=1 is calculated using the grating fundamental law:

$$m\lambda = (n_{ar} \sin(\theta_i) + n_m \sin(\theta_1))D \quad (1)$$

where $n_m$ is the refractive index of the medium underneath the grating and D is the micro- or nano-focusing element diameter (D=d). Depending on the distance of the photoresist to the micro- or nano-particles, $n_m$ is either the refractive index of the photoresist $n_{PR}$ (FIGS. 5(a) and 5(b)) or that of the air $n_{ar}$ (FIGS. 5(c) and 5(d)). Under normal incidence $\theta_i$=0, the orders ±1 exist if the angle $\theta_1$ associated to the order 1 is smaller than the maximum angle $\theta_{max}$ transmitted by the micro- or nano-particles and related to their numerical aperture.

The back focal length (BFL), the effective focal length (EFL) and the numerical aperture (NA) of a micro- or nano-focusing elements can be written, respectively, as follows:

$$BFL = EFL - \frac{D}{2} = \frac{n_{bl}D}{4(n_{bl}-1)} - \frac{D}{2} \quad (2)$$

$$NA = 2a\frac{(n_{bl}-1)}{n_{bl}D} \quad (3)$$

where a is the aperture, which in the present case of normal incidence and D is the micro- or nano-focusing element diameter (D=d). NA gives the maximum angle $\theta_{max}$ for the transmitted optical field according to Equation (4):

$$\sin(\theta_{max}) = \frac{1}{n_m}\frac{2(n_{bl}-1)}{n_{bl}} \quad (4)$$

The condition for coexistence of the transmitted grating orders ±1 is:

$$\sin(\theta_{max}) = \sin(\theta_1) = m\frac{\lambda}{n_m D} \quad (5)$$

FIG. 5(b) shows the dependence of $\theta_{max}$ and $\theta_1$, respectively, as a function of the diameter D (dashed line for $\theta_{max}$ and solid line for $\theta_1$). $\theta_{max}$ is shown independent of D and it appears as a horizontal line in FIG. 5(b). Data shown in FIG. 5(b) further illustrates the fact that for D greater than a critical value $D_\theta$, (i.e., 624 nanometers) the angle of the transmitted grating orders ±1 can be smaller than the aperture angle. It follows that interference between these two grating orders may occur. The critical diameter $D_\theta$ for the self-organized micro- or nano-focusing elements to make a phase-mask is written as:

$$D_\theta = m\frac{n_{bl}\lambda}{2(n_{bl}-1)} \quad (6)$$

Under this assumption and with the current parameters (the light source has a wavelength of 405 nanometers), $D_\theta$ is 624 nanometers. This imposes a lower limit on the diameter D of the micro- or nano-particles for making such a phase mask. This limiting case of $D_\theta$ is indicated with a solid vertical line in FIGS. 5(b) and 5(c). Above $D_\theta$, an angular condition of $\theta_1 > \theta_{max}$ leads to the coexistence of transmitted grating orders +1 and −1. It imposes a theoretical lower limit $D_\theta$=624 nanometers for the case of forming phase-mask and thus causes a reduced lattice period of $$\frac{D_\theta}{2}$$

which remains larger than the Abbe limit. Another aspect of wave interference can be referred FIG. 5(a) when the optical wave emitted from the first micro- or nano-focusing element (MS1, center O1) with angle $\theta_{max}$ interferes constructively at point A with wave emitted from the second micro- or nano-focusing element (MS2, center O2).

Knowing the distance D between the micro- or nano-focusing elements MS1 and MS2, the distance h from the plane of focus to the plane of interference may be calculated from the relation in the triangle HBA.

$$h = \frac{D}{2\tan(\theta_{max})} \quad (7)$$

By substituting the angular function of $\theta_{max}$ from Equation (5) to Equation (7) and note a linear relation between the distance S and h as follows:

$$S = BFL + h \quad (8)$$

With further mathematical manipulation, an S-D relation is obtained according to Equation (9):

$$S = D\left(\frac{n_{bl}}{4(n_{bl}-1)} - \frac{1}{2} + \sqrt{\left(\frac{n_m n_{bl}}{2(n_{bl}-1)}\right)^2 - 1}\right) \quad (9)$$

Equation (9) is plotted on FIG. 5(c). This curve shows a minimum distance h=0.7 micrometers to h=2.8 micrometers, according to a variation of micro- or nano-focusing element diameter from 600 to 2400 nanometers, is required to achieve a phase mask behavior with a period of the fringes equal to the half of the micro- or nano-focusing element diameter.

EXAMPLE

In order to investigate the diameter dependence of the photomask properties, different mono-dispersed spherical micro- or nano-particles made from silicon dioxide ($SiO_2$) and polystyrene (PS), with different diameters were prepared. The nano-particles had the following diameters: 800 nanometers, 1 micrometer, 1.25 micrometer, 1.53 micrometer, 2 micrometer, and 2.34 micrometers for $SiO_2$ and 1.68 micrometer for PS.

The $SiO_2$ micro-nanoparticles were prepared by the modified Stober and sol-gel processes in an alcohol-rich phase (W. Stöber, A. Fink, and E. J. Bohn, "Controlled growth of monodisperse silica spheres in the micron size range," J. Colloid Interface Sci. 26(1), 62-69 (1968)). Fresh alcohol, purified water, and ammonium hydroxide were firstly added into a sealed bottle and well mixed by a magnetic stirrer. Tetraethylorthosilicate (TEOS) was then introduced into the system. This would change the transparent solution into a milk-like solution. After stirring for 2 hours, the milk like solution was subject to a centrifugal force to collect the $SiO_2$ microspheres. The latter were washed with fresh alcohol three times before the $SiO_2$ micro-nanoparticles are dispersed into an alcohol phase. The solid content of the dispersed $SiO_2$ spheres was controlled to be about 10 wt % (C.-H. Chan, A. Fischer, A. Martinez-Gil, P. Taillepierre, C.-C. Lee, S.-L. Yang, C.-H. Hou, H.-T. Chien, D.-P. Cai, K.-C. Hsu, and C.-C. Chen, "Anti-reflection layer formed by monolayer of microspheres," Appl. Phys. B 100(3), 547-551 (2010)).

The manufacturing of the micro- or nano-structured photomask was based on a dip-coating method. The $SiO_2$ micro-nanoparticles were dip-coated on both sides of a double-stacked quartz slides. The slides were immersed into the solution of micro nanoparticles and vertically withdrawn at a speed of 5 mm/s (millimeters per second). The pair of coated quartz slide samples were separated and heated at 100° C. in the air for 10 minutes to remove the residue of solution.

The mono-dispersed PS micro-nanoparticles were synthesized via emulsion polymerization at 70° C. After heating at 70° C. for 24 hours, the latex was centrifuged. The PS micro-nanoparticles were collected and washed with methyl alcohol six times to remove the remaining impurities. They were then dispersed into a solvent. The solid content was controlled to about 10 wt %. After fabricating the PS spheres, they were deposited in a highly ordered self-organized structure on a quartz substrate by a dip coating method (C.-H. Chan, C.-H. Hou, C.-K. Huang, T.-J. Chen, S.-Z. Tseng, H.-T. Chien, C.-H. Kuo, K.-H. Hsieh, Y.-L. Tsai, K.-C. Hsu, and C.-C. Chen, "Patterning periodical motif on substrates by monolayer of microspheres: Application on GaN light-emitting diodes," Jpn. J. Appl. Phys. 48, 020212 (2009), and C.-H. Hou, S.-Z. Tseng, C.-H. Chan, T.-J. Chen, H.-T. Chien, F.-L. Hsiao, H.-K. Chiu, C.-C. Lee, Y.-L. Tsai, and C.-C. Chen, "Output power enhancement of light-emitting diodes via two-dimensional hole arrays generated by a monolayer of microspheres," Appl. Phys. Lett. 95(13), 133105 (2009)).

The patterning process started with the cleaning of ITO coated glass used as a substrate for the OLEDs. AZ-1505 (MicroChemicals) was used as a positive photoresist and diluted with AZEBR solvent (MicroChemicals) with a volume ratio=2:1 (2 parts for 1 part of AZ-1505). The photoresist was then spin coated on the ITO coated substrate at 6000 rpm for 60 seconds. The thickness of the deposited photoresist was 190 nanometers as measured by profilometer (Alpha-Step IQ Surface Profiler). The photoresist at the edge of the substrate was thicker as more resist is accumulated during the spin coating process. This edge bead was removed by AZ-EBR solvent to improve the flatness of the samples and ultimately to improve the contact between the surface of the photoresist and the microsphere mask.

The sample was soft-baked for 120 seconds at 100° C. before UV exposure. A printed plastic mask with 4×5 mm² rectangular transparent region surrounded by UV blocking region was used as a contour mask to select the region where the pattern is to be transferred onto the substrate. This ensures that the OLED area is defined by the region defined by the transparent part of the plastic mask. The photomask was prepared by forming a monolayer of self-organized silica micro-spheres on a pre-cleaned quartz substrate as mentioned above.

The samples were prepared as follows:

For a first batch of 7 samples (among which S1, S2, S3 and S5), the part of photomask containing the single layer of micro- and nano-particles was brought into contact with the photoresist, as illustrated on FIGS. 4(a) and 4(b).

For a second batch of 5 samples (among which S4 and S6), the part of photomask containing the single layer of micro- and nano-particles was maintained at a distance from the photoresist, as illustrated on FIGS. 4(c) and 4(d).

The same self-organized micro-nanoparticles based photolithography masks were used for preparing the samples of the first batch and the samples of the second batch.

Each sample was subjected to UV light exposure (12.5 milliwatt per square centimeter (mW/cm²)) through the monolayer of micro-spheres mask for 0.9 second. The exposed resist was then removed by AZ-726-MIF (MicroChemicals) developer for 9 seconds. The sample was then rinsed in deionized water to remove the remaining developer and blow-dried with nitrogen.

Figure 6A:
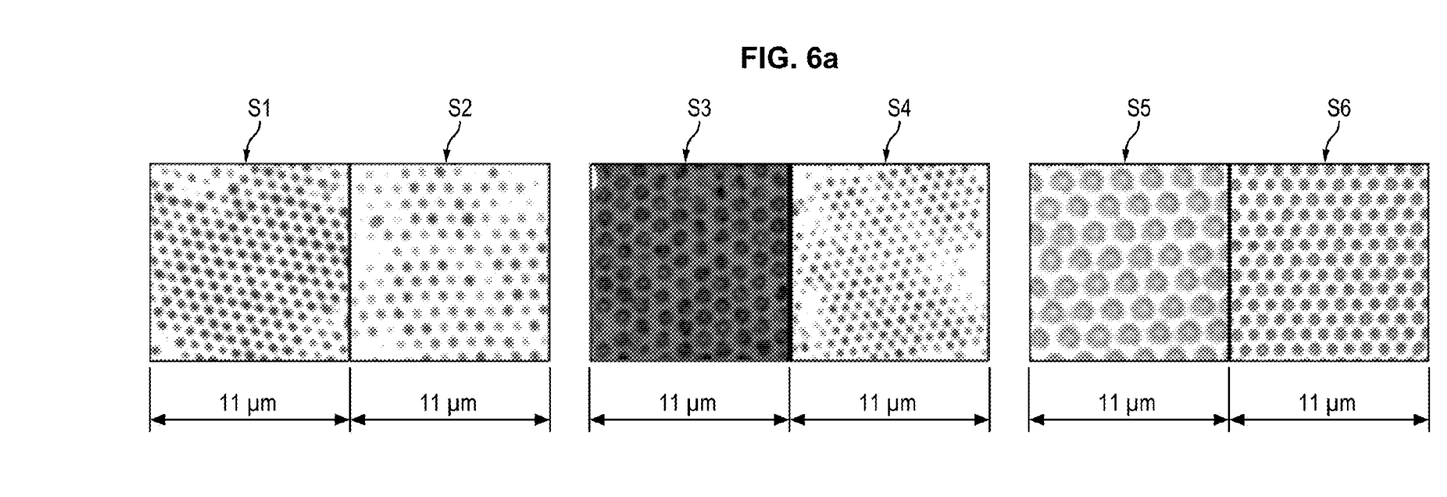
FIGS. 6(a) and 6(b) show different spatial periods of the pattern and different sizes of nano- or micro-holes created in the layer of light sensitive material, obtained for different sizes of micro- or nano-particles.

For the different particle sizes, the hole diameters and the lattice periods were measured in each sample. Images of the samples S1 to S6 are shown on FIG. 6(a). The results of the measurements are summarized in the diagram of FIG. 6(b).

Figure 6B:
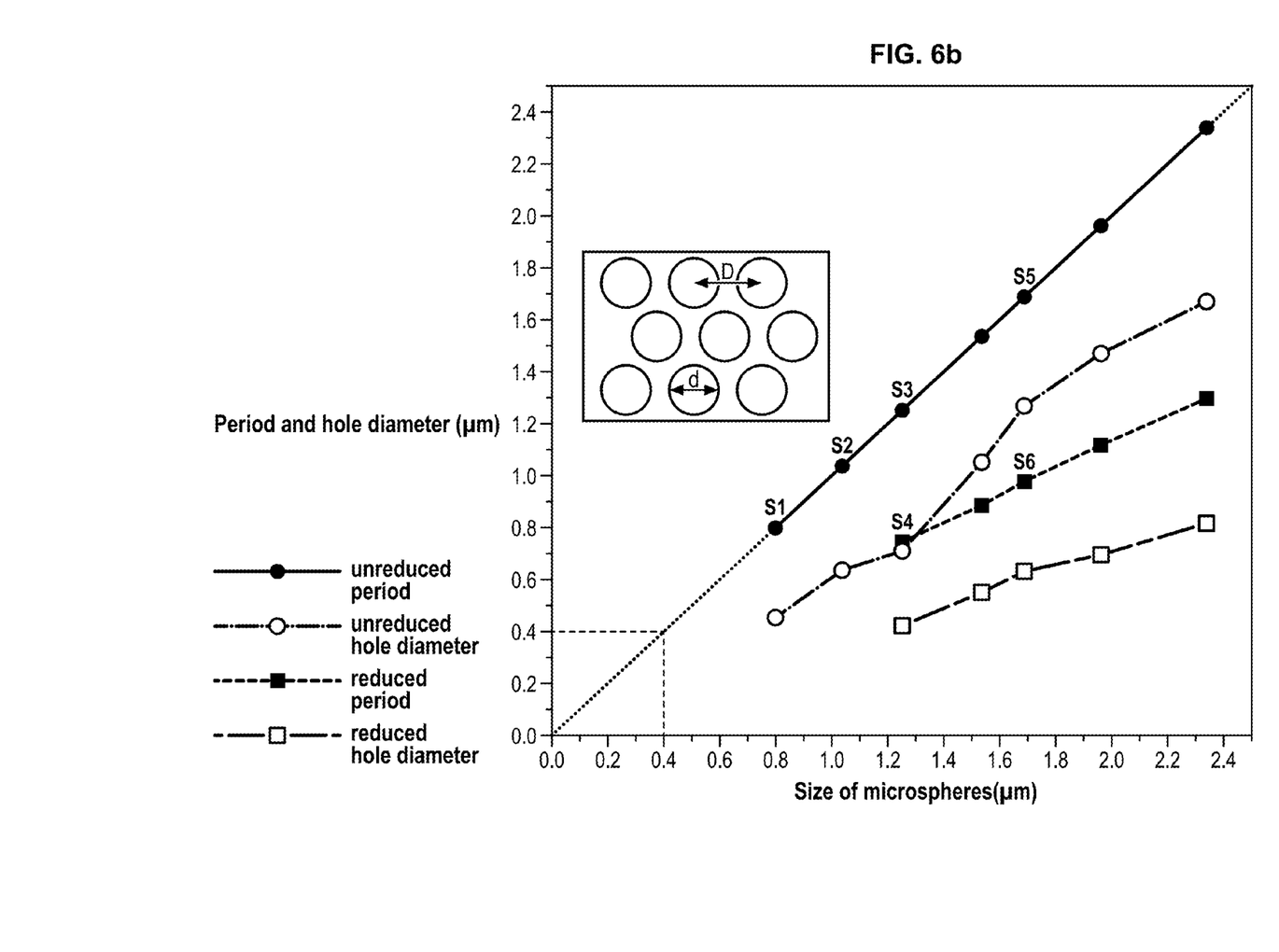

The round dots corresponding to the period of the nanostructures obtained when the particles are in contact with the photoresist layer, are perfectly aligned and exhibits a slope of 1±0.1 which confirms that the self-organized micro-nanoparticles lattice is exactly reproduced in the photoresist with a period equal to the particle diameter D. The hole diameters (empty circle) of this unreduced patterns exhibit a lower alignment with an averaged slope obtained by a linear regression of 0.69±0.1 indicating the proportion of the hole diameters to the particles size.

The black squared line on FIG. 6(b) clearly indicates a two-fold reduction of the pattern periods as compared to the particles diameter D used for the photomask. Indeed, a linear regression gives a slope of 0.51±0.1 indicating that the reduced pattern period is D/2 as expected from the interference between the orders +1 and −1 in a photomask with a pitch d=D. The hole diameters obtained (empty squares in FIG. 6) exhibit a linear regression with the diameter D giving a slope of 0.35±0.1 which corresponds to half the hole diameters obtained when the micro-particles are maintained at a distance from the photoresist layer.

Note that the smaller hole diameter obtained with 1.25 micrometers-micro-particles (sample S4) was 420 nanometers, which is close to the diffraction limit with a light source at $\lambda$=405 nanometers. In addition to that, the fabrication of nanostructures with a reduced period D/2 were not observed with particle diameter smaller than 1.25 micrometers, whereas the theory predicted a limit on the particle size at $D_\theta$=624 nm which was not achieved here. The difference may be due to the fact that a too large gap G between the photomask and the photoresist layer as compared to the spacing S required for particles size below 1.25 micrometers taking into account a tolerance T. More precisely, we assume the gap distance to be about 2 micrometers<G<5 micrometers.

Based on FIG. 5(c), for a diameter D<1 micrometer, a distance S<1.5 micrometers, the estimated tolerance from the z range of existence of the interferences is approximately T=0.5 micrometers. We speculate that the reason why the reduced pattern is not obtained when D<1.25 micrometers is that S+T<G.

Finally, two types of 2D reduced arrays of green OLEDs were fabricated based on 1.68 micrometers PS micro-nanoparticles and 1.25 micrometers $SiO_2$ micro-particles resulting in 910 nanometers and 750 nanometers lattices with 650 nanometers and 420 nanometers hole diameters, respectively.

The OLED layers were deposited onto the opening holes of the patterned photoresist, by evaporation at a vacuum pressure of 2.10-7 Torr. The green heterostructure was composed of a 40 nanometers thick 4,4',4'',tris-(3-methylphenylphenylamino) triphenylamine (m-MTDATA) layer as hole injection layer (HIL), a 15 nm of N,N'-diphenyl-N,N'-bis(1-naphthyl)-1,1'-biphenyl-4,4-diami (NPD) as a hole transport layer, a 50 nanometers of Tris(8-hydroxyquinolinato) aluminum (AlQ3) host material as the emissive layer (EL) with an intrinsic peak emission centered at 520 nanometers. The organic layers were followed by a 1 nanometer of lithium fluoride (LiF) and a 150 nanometers thick aluminum (Al) layer as a cathode that was vapor deposited at the same background pressure.

The red organic heterostructure was constructed as follows: a 40 nm thick m-MTDATA layer, a 15 nm thick NPD layer, a 30 nm of AlQ3 doped DCM2 (4-(dicyanomethylene)-2-methyl-6-(p-dimethylaminostyrl)-4H-pyran) as the red emitting layer. The emitting zone was embedded within the 30 nanometer thick AlQ3:DCM2 emitting layer. The heterostructure was completed with a 10 nanometer thick BCP (bathocuproine: 2,9-Dimethyl-4,7-diphenyl-1,10- phenanthroline)hole blocking layer, and a 10 nm thick Alq3 layer as an electron emitting layer. Finally we added a 1 nanometer thick lithium fluoride (LiF) and a 150 nanometer thick aluminum layer to form the cathode. In total, the OLED hetero-structure thickness without the aluminum layer was 105 nanometer with an active area of 4×5 mm².

The invention claimed is:

1. A method for making a micro- or nano-scale patterned layer of material by photolithography, comprising:
    in a first step, positioning a photomask between a light source and a photoresist layer, said photomask comprising a support and a layer of adjacent spherical micro- nano-particles arranged on the support, each particle having a diameter D,
    in a second step, activating the light source, so that the light source emits light radiations through the support and the adjacent spherical micro- or nano-particles of the photomask, towards the photoresist layer,
    in a third step, developing the photoresist layer so as to obtain the micro- or nano-scale patterned layer of material,
    wherein, during the first step, the photomask is displaced relative to the photoresist layer:
    from a first position wherein the photomask is in contact with the photoresist layer under vacuum or under mechanical pressure,
    to a second position, different from the first position, by introducing a gap of air between the photoresist layer and the layer of adjacent spherical micro- or nano-particles,
    so that during the second step, light radiations stemming from focusing of each spherical micro- or nano-particles and light radiations stemming from constructive interferences between adjacent spherical micro- or nano-particles allow to generate, in the photoresist layer, a micro- or nano-scale pattern with a spatial period p smaller than the diameter D of the spherical micro- or nano-particles.

2. The method as defined in claim 1, wherein the gap of air is adjusted so that the spatial period p of the micro- or nano-scale pattern is equal to half the diameter D of the micro-or nano-spherical spheres.

3. The method according to claim 1, wherein the support has at least one planar surface and the spherical micro- or nano-particles are self-organized and disposed in an array on the planar surface.

4. The method according to claim 1, wherein the diameter of the micro- or nano-spherical particles is less than 2 micrometers for obtaining micro- or nano-holes or pillars forming the pattern, the pattern having a spatial period p less than 1 micrometer and each micro-or nano-hole or pillar having a diameter f less than 420 nanometers.

5. The method according to claim 1, wherein the photomask is displaced in translation relative to the photoresist layer of light sensitive material by piezoelectric shims.

6. The method according to claim 1, wherein the distance between a middle plane of the light sensitive photoresist layer and the layer of micro- or nano particles is greater than a back focal length of the micro- or nano particles.

7. The method according to claim 1, wherein the gap has a thickness less than 20 micrometers.

8. The method according to claim 7, wherein the adjacent micro- or nano-particles are in contact with each other in the layer of micro- or nano-particles.

9. The method according to claim 1, wherein the light source emits light radiations at a wavelength comprised between 125 and 405 nanometers.

10. The method according to claim 1, wherein the support is made of a material which is transparent at a wavelength of the radiations emitted by the source and comprises a planar surface on which the micro- or nano-particles are attached.

11. The method according to claim 1, wherein the photoresist layer of light sensitive material is a positive resist, so that the micro- or nano-scale patterned layer of material is patterned with micro- or nano-holes.

12. The method according to claim 1, wherein the photoresist layer of light sensitive material is a negative resist, so that the so that the micro- or nano-scale patterned layer of material is patterned with micro- or nano-pillars.

* * * * *